United States Patent
Eason et al.

(10) Patent No.: US 6,670,280 B2
(45) Date of Patent: Dec. 30, 2003

(54) METHODS OF MICROSTRUCTURING FERROELECTRIC MATERIALS

(75) Inventors: Robert William Eason, Hampshire (GB); Paul Brown, Hampshire (GB); Sakellaris Mailis, Hampshire (GB)

(73) Assignee: University of Southampton, Hampshire (GB)

( * ) Notice: Subject to any disclaimer, the term of this patent is extended or adjusted under 35 U.S.C. 154(b) by 0 days.

(21) Appl. No.: 10/170,338

(22) Filed: Jun. 14, 2002

(65) Prior Publication Data
US 2003/0008418 A1 Jan. 9, 2003

Related U.S. Application Data

(60) Provisional application No. 60/300,435, filed on Jun. 26, 2001.

(30) Foreign Application Priority Data

Jun. 15, 2001 (EP) .............................................. 01305202

(51) Int. Cl.$^7$ .......................... H01L 21/302; G03C 5/00
(52) U.S. Cl. ........................ 438/736; 438/950; 438/952; 438/737; 438/3
(58) Field of Search .................................. 438/736, 738, 438/772, 756, 950, 952, 3; 430/197

(56) References Cited

U.S. PATENT DOCUMENTS

| | | | |
|---|---|---|---|
| 4,598,039 A | | 7/1986 | Fischer et al. |
| 4,661,201 A | | 4/1987 | Petridis et al. |
| 5,271,797 A | * | 12/1993 | Kamisawa .................... 216/87 |
| 5,627,013 A | * | 5/1997 | Kamisawa .................... 430/325 |
| 5,674,758 A | * | 10/1997 | McCarthy ..................... 438/26 |
| 5,756,147 A | * | 5/1998 | Wu et al. ..................... 427/66 |
| 5,846,686 A | * | 12/1998 | Kamisawa .................... 430/197 |
| 6,048,588 A | * | 4/2000 | Engelsberg ................... 427/554 |
| 6,177,351 B1 | * | 1/2001 | Beratan et al. ............... 438/694 |
| 6,372,306 B1 | * | 4/2002 | Smith et al. .................. 427/596 |
| 6,503,831 B2 | * | 1/2003 | Speakman .................... 438/674 |
| 6,524,964 B2 | * | 2/2003 | Yu ................................ 438/736 |

FOREIGN PATENT DOCUMENTS

| | | |
|---|---|---|
| WO | WO 98/46813 | 10/1998 |
| WO | WO 00/07231 | 2/2000 |

OTHER PUBLICATIONS

Barry, Ian E., "Light-induced frustration of etching in Fe-doped LiNbO$_3$", Applied Surface Science, 143, pp. 328–331 (1999).

Boyland, Alexander et al., Latency effects and Periodic Structures in Light-induced Frustrated Etching of FE:doped LiNbO$_3$, Applied Physics Letters, 77, pp. 2792–2794 (2000).

Ross, Mailis, et al., "Fabrication of Surface Relief Gratings on Lithium Niobate by Combined UV Laser and Wet Etching", Electronics Letters, vol. 36, No. 21, p. 1801, (2000).

Mailis, Sakellaris, et al., "Etching and Printing of Diffractive Optical Microstructures by a Femtosecond Excimer Laser", Applied Optics, vol. 38, No. 11, pp. 2301–2308 (Apr. 1999).

* cited by examiner

*Primary Examiner*—Michael S. Lebentritt
(74) *Attorney, Agent, or Firm*—Finnegan, Henderson, Farabow, Garrett & Dunner, L.L.P.

(57) ABSTRACT

A method of micro-structuring a surface of a sample of ferroelectric material, the method comprising: (a) taking a sample of ferroelectric material having a −z face which is to be etched; (b) illuminating the −z face with ultraviolet light to define illuminated and unilluminated parts of the surface; and (c) immersing the −z face in an etchant to selectively remove the unilluminated parts of the −z face at a greater rate than the illuminated parts. The method can be carried out using pulsed ultraviolet light to etch lithium niobate crystals cut for etching on the −z face, and may further be combined with ablation to produce multi-level surface structures.

13 Claims, 8 Drawing Sheets

METHODS OF MICROSTRUCTURING FERROELECTRIC MATERIALS

CROSS REFERENCE TO RELATED APPLICATIONS

This application claims the benefit of U.S. Provisional Application No. 60/300,435, filed Jun. 26, 2001, the content of which is incorporated herein by reference, and claims the right to priority based on European Patent Application No. 01305202.2, filed Jun. 15, 2001.

BACKGROUND OF THE INVENTION

The invention relates to microstructuring ferroelectric materials, more especially but not exclusively to methods of etching ferroelectric materials and to methods of frustrating etching in ferroelectric materials.

Ferroelectric materials are of great interest to the optics, telecommunications and laser communities. Some of these materials, particularly lithium niobate, have large electro-optic and non-linear optical coefficients, and hence have extensive application in piezoelectric, acousto-optic, pyroelectric and photorefractive devices. This remarkable range of electrical and optical phenomena has been widely exploited in a number of technological applications.

However, many applications depend upon the ability to micro-machine ferroelectric crystals by the selective removal of material. These range from relief grating patterning, where sub-micron periods are required, to bulk micro-machining for improved modulator performance, fabrication of photonic band gap devices, or use in micro-electro-mechanical systems and micro opto-electro-mechanical systems. Conventional techniques for microstructuring lithium niobate include direct laser machining (pulsed laser ablation), and a range of etching procedures. The technique of wet-etching, in which combinations of acids are used to remove surface material from crystals, is extremely hard to localize without attendant undercutting, and compromise of feature integrity. Etching also requires additional precision mask-making or photo-lithographic steps, and this has cost and time implications.

It has been shown that in iron-doped lithium niobate ($Fe:LiNbO_3$), wet-etching with a solution of HF and $HNO_3$ acids can be resisted, or frustrated, by illuminating the surface of the $Fe:LiNbO_3$ during etching with continuous wave (CW) 488 nm visible radiation [1, 2]. It has been shown that the CW 488 nm radiation can reduce or completely inhibit the etching behavior of the material. This etch frustration effect can be used to structure the surface of the material by selective exposure of parts of the surface during etching.

The precise surface science behind this etch frustration effect is not known. It has however been established from experiments that the effect does not exist with undoped $LiNbO_3$. It appears only to function with $Fe:LiNbO_3$. A degree of latency in the effect with a time constant of a few hours has also been observed [2]. In these observations, the $Fe:LiNbO_3$ was immersed in etchant for a period of five hours and exposed to the illumination only for a one hour period at different stages over the five hours. These experiments show that the etch frustration effect is not triggered until illumination is started, but continues for some hours after illumination has been removed. The effect is believed to arise from absorption of 488 nm radiation by the Fe dopant atoms, which generates mobile charge carriers in the form of electrons. The visible light makes charge move to the crystal surface. The presence of this charge rich surface layer disables the surface etch chemistry while the $Fe:LiNbO_3$ surface is immersed in the etchant acid solution of HF and $HNO_3$.

A further etch frustration effect has also been reported in which $Fe:LiNbO_3$ is irradiated by pulsed 248 nm ultraviolet (UV) radiation and subsequently etched (see ref [2] FIG. 4(b) and text at page 2793, right hand column).

Although the etch frustration effect in $Fe:LiNbO_3$ is of interest for holographic storage applications, the presence of Fe is undesirable in most if not all other applications, since Fe increases the photorefractive response by providing a source of extrinsic charge (electrons usually). Light excites the Fe via the $Fe^{2+} \rightarrow Fe^{3+} + e$ reaction. The electrons liberated then move by diffusion and drift, and a charge pattern is set up. This makes the crystal host highly affected by light, which is desirable for holographic storage, but undesirable for any devices that exploit electro-optic, piezoelectric, or nonlinear responses, for example.

An etch enhancement effect has been reported for pure $LiNbO_3$ and $Ti:LiNbO_3$ [3]. In this work, pulsed UV radiation at 248 nm is used in a first step to selectively irradiate the +z surface of the $LiNbO_3$. The sample is then etched in a second step using an etchant solution of HF and $HNO_3$. The etchant preferentially attacks the irradiated areas. The method is said to be crystal-cut insensitive, with fabrication of surface relief gratings being reported on both x-cut and z-cut $LiNbO_3$. However, a limitation of this effect is that the etch enhancement only appears to allow shallow structures to be etched, of the order of 50–100 nm in depth. The effect is thus not capable of forming general micro-structuring, for example it is not capable of creating mesa structures, trenches, or ridge waveguides on the micron scale.

$LiNbO_3$ and other ferroelectrics etch very differently on the +z face compared to the −z face. The −z face etches relatively rapidly and deeply (0.6 to 0.8 $\mu$m per hour at room temperature for $LiNbO_3$ in HF and $HNO_3$) while, as mentioned above for $LiNbO_3$, the +z face only etches to nanometer depths. Therefore, etching of the −z face can produce far more useful structures than etching of the +z face.

The difference in etching behavior for the two faces may be attributable to a variety of causes. For example, the bonds between the metal-oxygen ions are shorter on the +z face, so are likely to be more stable and less reactive than the longer bonds on the −z face. Therefore the +z face will resist etching so that only shallow features can be formed by the +z face etch enhancement technique.

This differential etching has been utilized in a reported method of surface structuring [4]. A ferroelectric wafer is poled to form a distribution of +z and −z areas corresponding to the desired surface structure. The poled wafer is then etched, and the −z areas are removed by the etchant to a greater depth than the +z areas. The poling process requires the application of a photoresist mask to the wafer. Moreover, the wafer needs to be 'pre-poled' before poling to initially arrange all the domains in the same orientation.

SUMMARY OF THE INVENTION

A first aspect of the present invention is directed to a method of structuring a surface of a sample of ferroelectric material, the method comprising:

a) taking a sample of ferroelectric material having a −z face which is to be etched;

b) illuminating the −z face with ultraviolet light to define illuminated and unilluminated parts of the surface; and c) immersing the −z face in an etchant to selectively remove the unilluminated parts of the −z face at a greater rate than the illuminated parts.

The method allows the frustration of wet-etching techniques to be used to apply high quality micron and submicron scale patterns and structures to the surfaces of samples of ferroelectric materials, without the requirement for the illumination to be done during the wet-etching process or that Fe be present in the material. This flexibility is advantageous because it allows for the illumination and etching steps to performed at different times and/or at different locations, to suit the requirements of the user. It arises from the fact that the frustration effect is retained by the ferroelectric material after the illumination ceases, so that the wet-etching does not need to be performed contemporaneously with the illumination. However, it will be understood that the etching may also be carried out during the ultraviolet illumination in other embodiments.

The method may be carried out with ferroelectric material that is not doped with iron, thus allowing widespread application of the method. Specifically, the ferroelectric material may contain less than 0.01 wt % of iron (or lower values such as 0.008, 0.006, 0.004, 0.002, 0.001, or 0.0001 wt %), whereas inclusion of at least 0.05 wt % iron is usual for holographic storage applications. The method can thus be applied to nominally undoped ferroelectric material, specifically to ferroelectric material not intentionally doped with iron.

A second aspect of the present invention is directed to a method of structuring a surface of a sample of ferroelectric material, the method comprising:

a) taking a sample of ferroelectric material having a face which is to be structured;

b) modifying parts of the face by illumination with ultraviolet light having an energy fluence below the threshold for ablating the material, so that the parts of the face which are modified become more resistant to subsequent wet-etching than the parts of the face which have not been illuminated; and c) ablating parts of the face by illumination with ultraviolet light having an energy fluence above the threshold for ablation of the material so that those parts of the face are removed by ablation.

Supplementing the etch-frustration with material ablation gives a versatile method by which multilayer surface structures can be created.

BRIEF DESCRIPTION OF THE DRAWINGS

For a better understanding of the invention and to show how the same may be carried into effect reference is now made by way of example to the accompanying drawings in which.

DETAILED DESCRIPTION

First Embodiment

Figure 1:
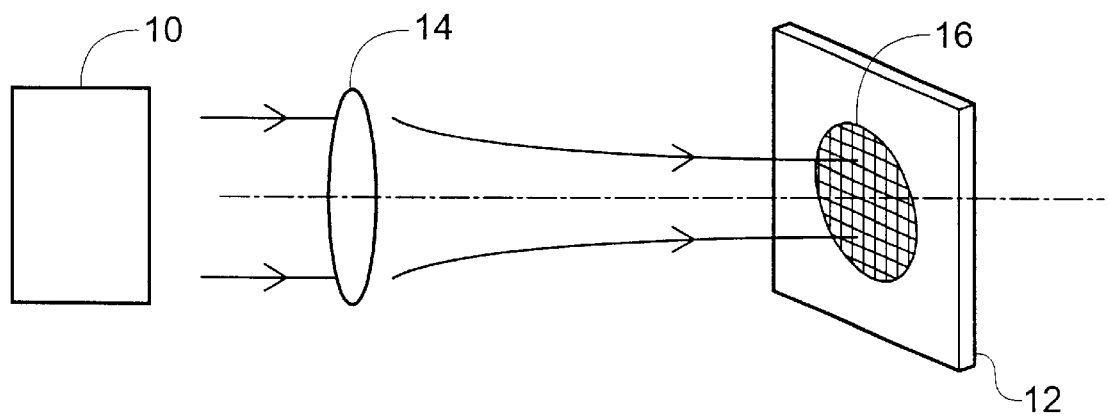
FIG. 1 shows a schematic diagram of apparatus suitable for carrying out a first step of a method according to a first embodiment.

FIG. 1 is a schematic diagram of apparatus suitable for carrying out a first step of a method of microstructuring ferroelectric material, the first step being selective illumination of a surface of the material.

A beam of light from an ultraviolet light source 10 is arranged to illuminate the surface of a sample 12 of the ferroelectric material which is to be subjected to the method. The light source may be, for example, a laser. A convex lens 14 is used to focus or image the light onto the surface of the sample 12. This is a particularly simple arrangement for directing the light onto the sample 12. More complicated arrangements may be used if appropriate. For example, more lens, apertures, attenuators and the like can be used to modify the beam. Moreover, equivalent mirror arrangements may be used instead of or in combination with lens arrangements.

A mask 16 is applied to the surface, or face, of the sample 12, to transmit a pattern of illumination. This means that parts of the surface are exposed to the light and other parts are not. The mask 16 shown in FIG. 1 is a simple grid, for example a transmission electron microscope grid, and is for the purposes of illustration only. In reality, more complex patterns will be required to be etched onto the sample surface, so masks with corresponding patterns can be used for this. Any other method of modifying the pattern of light falling onto the sample 12 can be used instead of a mask. For example, interfering two incident beams at the surface of the sample 12 will give a pattern of light and dark fringes suitable for etching a grating.

Figure 2:
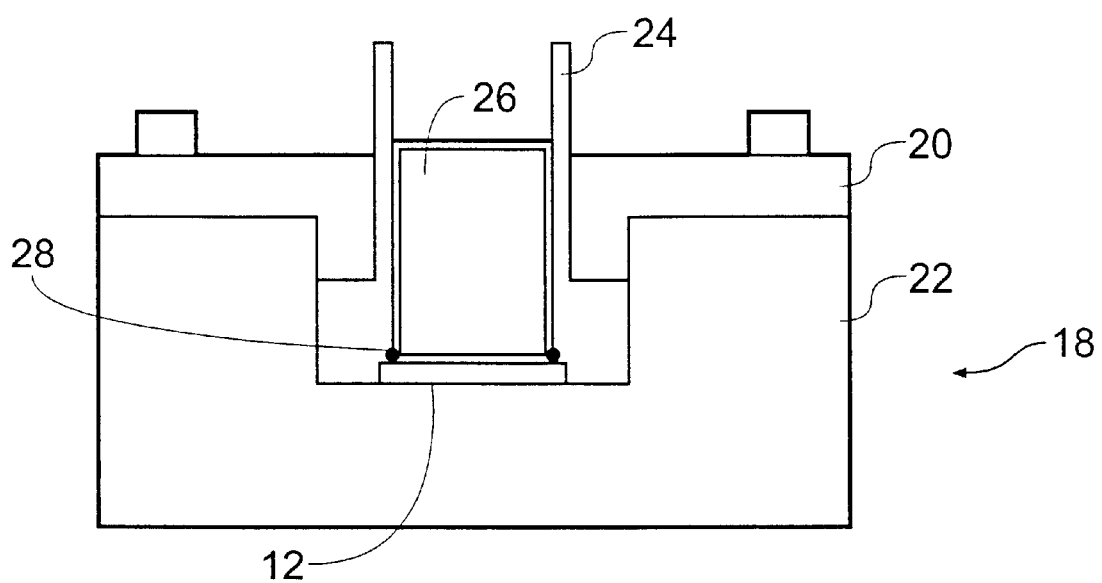
FIG. 2 shows a schematic diagram of apparatus suitable for carrying out a second step of a method according to the first embodiment.

FIG. 2 is a schematic diagram of apparatus suitable for carrying out the second part of the method. A wet-etching cell 18 comprises upper and lower parts 20, 22 made of stainless steel. The upper and lower parts 20, 22 define a central cavity which is partly lined with a polytetrafluoroethylene (PTFE) wall 24. The PTFE wall holds the liquid etchant 26 within the central cavity, and is sealed at its lower end by an O-ring 28. The material to be etched, in this case the sample of ferroelectric material, is placed at the bottom of the central cavity, with the surface to be etched uppermost.

Any other suitable method of immersing the irradiated sample in etchant may also be used.

Wet-etching is a conventional etching process in which chemical etchants, comprising, for example, liquid acids, are used to remove the surface of a sample of material in a desired pattern. Cells such as that shown in FIG. 2 are well-known. The etchant is a mixture of hydrofluoric (HF) and nitric ($HNO_3$) acids in the ratio 1:2. Other etchant ratios may be used. Moreover, other etchants are known and may be more or less suitable for etching particular ferroelectric materials.

The surface structuring method is performed by using the light source 10 to illuminate the surface of the sample 12 in a pattern corresponding to the desired etching. The parts of the surface which are intended to be etched away by subsequent wet-etching of the sample are not illuminated. The parts of the surface which are not intended to be etched away (and will therefore stand proud of the etched surface) are illuminated.

The illumination of the surface is stopped, after which the sample 12 is placed in the cell 18, and the etchant 26 is added to start the wet-etching process. The rate at which the particular etchant removes the material of which the sample is composed under the conditions applied will generally be known, and the etching process is carried out for the time needed to remove the required depth of material from the sample 12.

The effect of the illumination is to render those parts of the sample which are illuminated more resistant to conventional wet-etching than those parts which are not illuminated. The unilluminated parts are removed by the etchant used in the wet-etching process at the rate normal to the particular material, etchant composition, temperature and other relevant factors. The illuminated parts are removed at a much slower rate, owing to the resistance caused by the illumination. In fact, the resistance may be complete, so that the illuminated parts are not removed at all. This resistance effect that inhibits etching is known as frustration.

This effect is distinct from that observed in the wet-etching of illuminated $Fe:LiNbO_3$, where charge carriers arising from the dopant are thought to be responsible for frustration [1, 2]. This effect is also clearly distinct from the shallow etching effect with etch enhancement previously reported for the +z face of $LiNbO_3$ [3].

The level of etch frustration produced in the sample 12 depends on the energy fluence of the illumination (i.e. energy per unit area), and also the total accumulated energy dosage and rate of dosage. A higher energy fluence gives a higher level of etch frustration, so that the sample material is removed more slowly by the etchant. This offers the possibility of illuminating different parts of the sample surface with different energy fluences to give a multi-level structure after etching. A knowledge of the normal etch rate and of the dependence of frustration on energy fluence, both of which can be readily determined for a particular light source/sample/material/etchant combination, allows a precise surface structure with well-defined dimensions to be obtained by this etching method.

The etch frustration produced by the illumination has the particular benefit that an illuminated sample will retain its full level of frustration to etching after illumination has ceased. This means that it is not necessary to conduct the etching during, or immediately after the illumination. This offers the possibility of, for example, batch processing, or the illumination and etching being carried out at illumination and etching stations located at separate sites. This retained frustration is distinct from the latency observed in $Fe:LiNbO_3$ immersed in etchant while illuminated with visible light.

Pulsed ultraviolet light (with pulse durations from nanoseconds to femtoseconds) has been found to provide good results.

Results:

Experimental results were obtained by using apparatus of the type shown in FIGS. 1 and 2. The light source was a krypton fluoride (KrF) excimer laser producing ultraviolet light in the form of nanosecond pulses having a wavelength of 248 nm. It was used at an energy fluence of ~100 mJ $cm^{-2}$. The sample was a lithium niobate crystal cut for etching on the −z face, having a thickness of 1 mm and being a nominally undoped single domain standard optical grade wafer. A TEM grid was adhered to the −z face, to give a pattern of illuminated and unilluminated parts.

After illumination, the sample was transferred to an etching cell and wet-etched with an etchant of HF and $HNO_3$ acids in a 1:2 ratio, to give an etched surface with structure.

Figure 3:
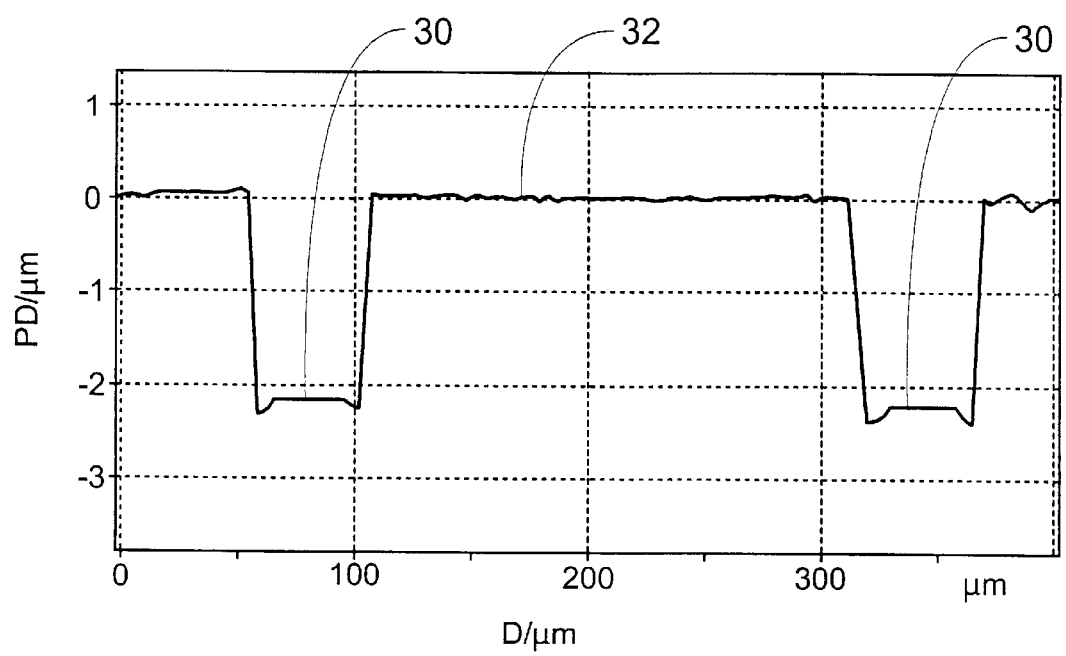
FIG. 3 shows an alpha-step profile scan of parts of the surface of a sample of material to which the method of the first embodiment has been applied.

FIG. 3 shows an alpha-step profile scan of the profile depth of part of the etched surface (profile depth PD against distance across surface D). The scan shows features 30 which have been etched away to a depth of over 2 µm on either side of a central feature 32 which has not been etched as much, and hence stands proud of the surface as a mesa structure. The etched features 30 are the parts of the sample which were unexposed to the ultraviolet illumination because they were under the lines of the TEM grid. The central feature 32 is one of the parts which lay between the TEM grid lines and hence was illuminated. Etching of this part was therefore frustrated, leaving it standing above the etched surface. The normal etch rate for the particular experimental arrangement was ~0.55 µm per hour, at which rate the etched features 30 were etched by the etchant. The frustrated etch rate of the central feature 32 was calculated to be only ~0.15 µm per hour, indicating that the illumination reduced the etch rate by ~75%.

Figure 4:
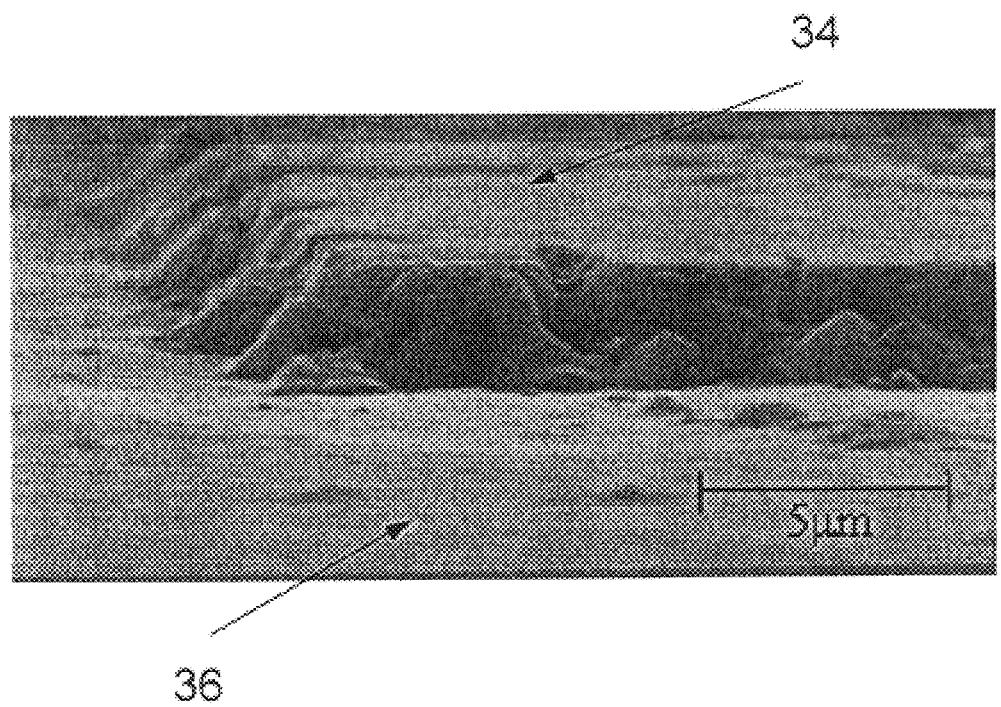
FIG. 4 shows a scanning electron micrograph of part of the etched surface of a sample of material to which the method of the first embodiment has been applied.

FIG. 4 shows a view of part of the etched surface, obtained with a scanning electron microscope. The upstanding feature 34 is a part of the sample which received illumination to frustrate the etching, and the lower area 36 received no illumination and hence was etched at the normal rate. The flat surfaces of both features 34, 36 appear relatively smooth after 20 hours of etching. The jagged sides of the upstanding feature 34 are thought to be due to the quality of the TEM grid used to provide the pattern of illumination.

Further results have been obtained by using UV light sources having wavelengths of 308 nm and 355 nm. Similar frustration producing effects have been distinctly shown at these wavelengths.

Second Embodiment

In a second embodiment, the UV illumination and selective etching steps of the first embodiment are combined with a selective ablation step, to provide micro structuring.

In general, materials have a threshold property which defines the level of energy fluence at a particular wavelength which a material can tolerate without being ablated. Therefore, for carrying out the first embodiment, it is important to keep the level of energy fluence used for the UV illumination to below the ablation threshold of the material. Otherwise, the precision of the final etched structure can be compromised. In the second embodiment, the power of the UV illumination is controlled below and above the ablation threshold so as to either induce later etch frustration or ablate material respectively.

According to this method, the illumination of the surface to provide etch frustration is carried out in the same way as has been described for the first embodiment. The apparatus shown in FIG. 1 is suitable for this. After the etch frustration has been achieved, different parts of the surface can be illuminated with a focused UV beam to cause selective ablation. The power density of illumination is above the ablation threshold, so that those parts of the surface which are illuminated are removed by ablation. The level of ablation, and hence the depth of sample material which is removed, depends on the duration of exposure to the illumination and on the energy fluence of the illumination. Therefore, the depth of material removed by this method can be controlled as required.

The method of the second embodiment can be carried out by using two masks, one mask for illumination for etch frustration marking, and another mask for the ablation. Energy density on the mask during the ablation can be kept below the damage threshold of the mask by performing focusing of the illumination onto the sample after the mask It is also possible to use a single focused UV light beam for direct writing, wherein the energy fluence is controlled to vary it above and below the ablation threshold during scanning. The beam may be rastered or otherwise scanned to perform such direct writing. In this way, both the "marking" of the surface to induce later etch frustration and the selective ablation are carried out together.

After the two stages of illumination have been performed, the sample is transferred to an etching cell to be wet-etched in the conventional manner, as described above. An essentially three-level surface structure results, comprising an upper level, a central level and a lower level. The uppermost level is formed by those parts which were frustrated by illumination below the ablation threshold. The central level is formed by those parts which received no illumination at all, and hence etched at the normal rate. The lower level is formed by those parts which received illumination above the ablation threshold and were hence removed by ablation. It is possible to increase the number of levels by varying the energy fluence of the illumination for frustration and ablation between different parts of the surface, since the amount of both frustration and ablation increases with increasing energy fluence.

Also, there is no need to perform the illumination for frustration before the illumination for ablation; these two processes can be reversed. This flexibility arises from the retention of the frustration effect, because the frustration will endure whilst the ablation is carried out. Also, the retention of the frustration allows for a delay between illumination and etching, so that the ablation step and etching step can be performed as a separate process at a later time, as convenient.

Results:

The results were obtained by using apparatus of the type shown in FIGS. 1 and 2. The light source was a KrF laser producing ultraviolet light in the form of 500 fs pulses having a wavelength of 248 nm. It was used at energy fluences both above and below the ablation threshold, and various numbers of pulses were used for illumination. The samples used were undoped lithium niobate crystals cut for etching on the –z face. The illumination pattern was achieved by spatially modulating the output of the laser by passing it through an optical system consisting of a specially modified optical microscope equipped with a Schwartzchild reflecting ×25 objective lens specially coated for high reflection at 248 nm, which enabled demagnification and projection of an aperture and also control of the energy throughput by an optical attenuator. In this manner high quality projection of various patterns of micron scale could be obtained.

After illumination, the samples were wet-etched with an etchant of HF and $HNO_3$ acids in a 1:2 ratio.

Figure 5:
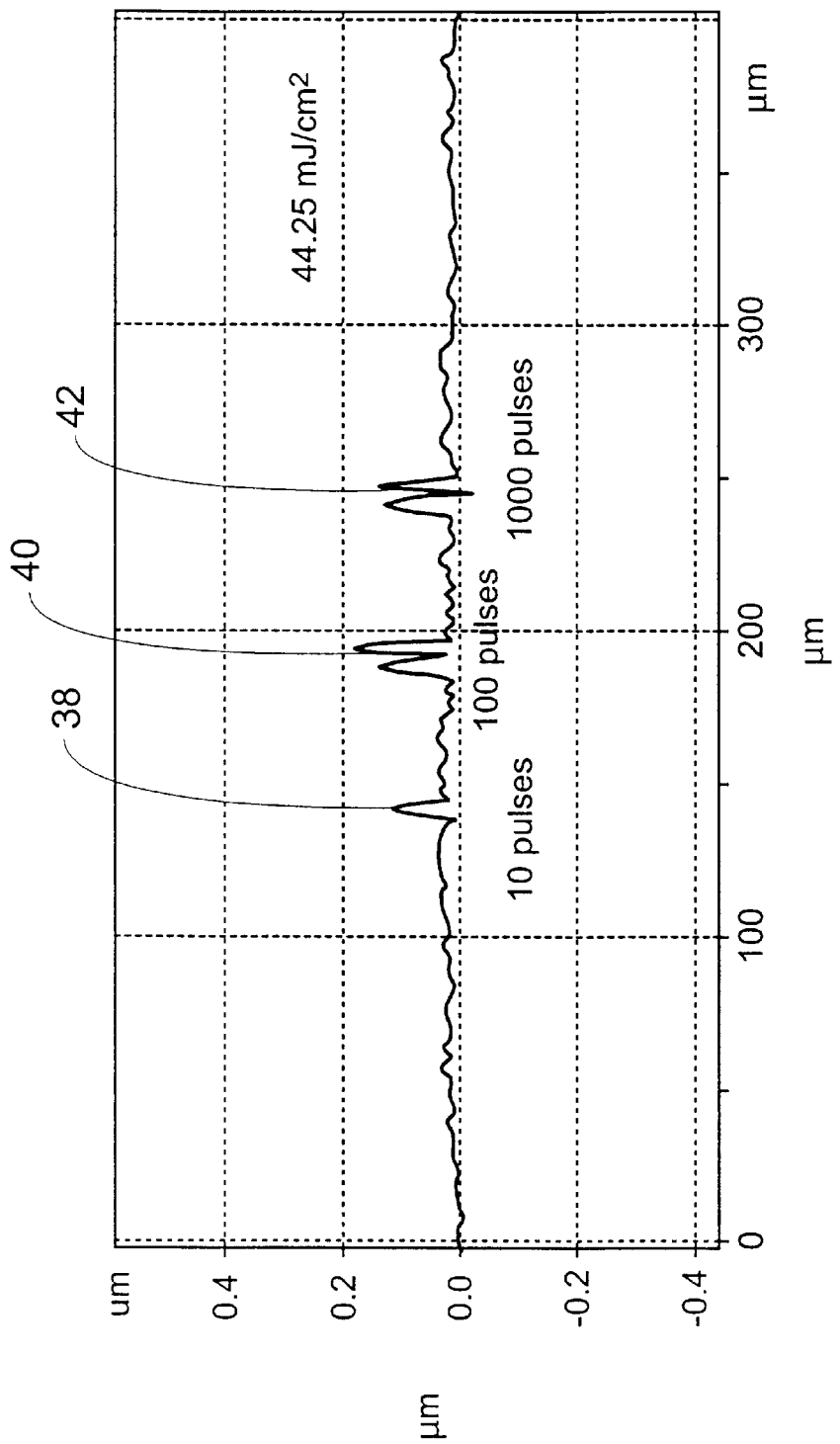
FIG. 5 shows an alpha-step profile scan of parts of the surface of a sample of material after applying a first step of a method according to a second embodiment.

FIG. 5 shows an alpha-step profile scan of parts of the surface which were exposed to an energy fluence below the ablation threshold and then wet-etched for one hour. The energy fluence was 44.25 $mJcm^{-2}$, and different parts of the surface were exposed to different numbers of pulses. All parts remain as upstanding features after etching, owing to the etch frustration caused by the illumination. The left-hand feature 38 on the scan received 10 pulses, the central feature 40 received 100 pulses, and the right-hand feature 42 received 1000 pulses. The central feature 40 and the right-hand feature 42 are substantially the same height, indicating that the frustration effect saturated at some point below 100 pulses. The etch frustration reduced the etch rate by ~20%.

Figure 6:
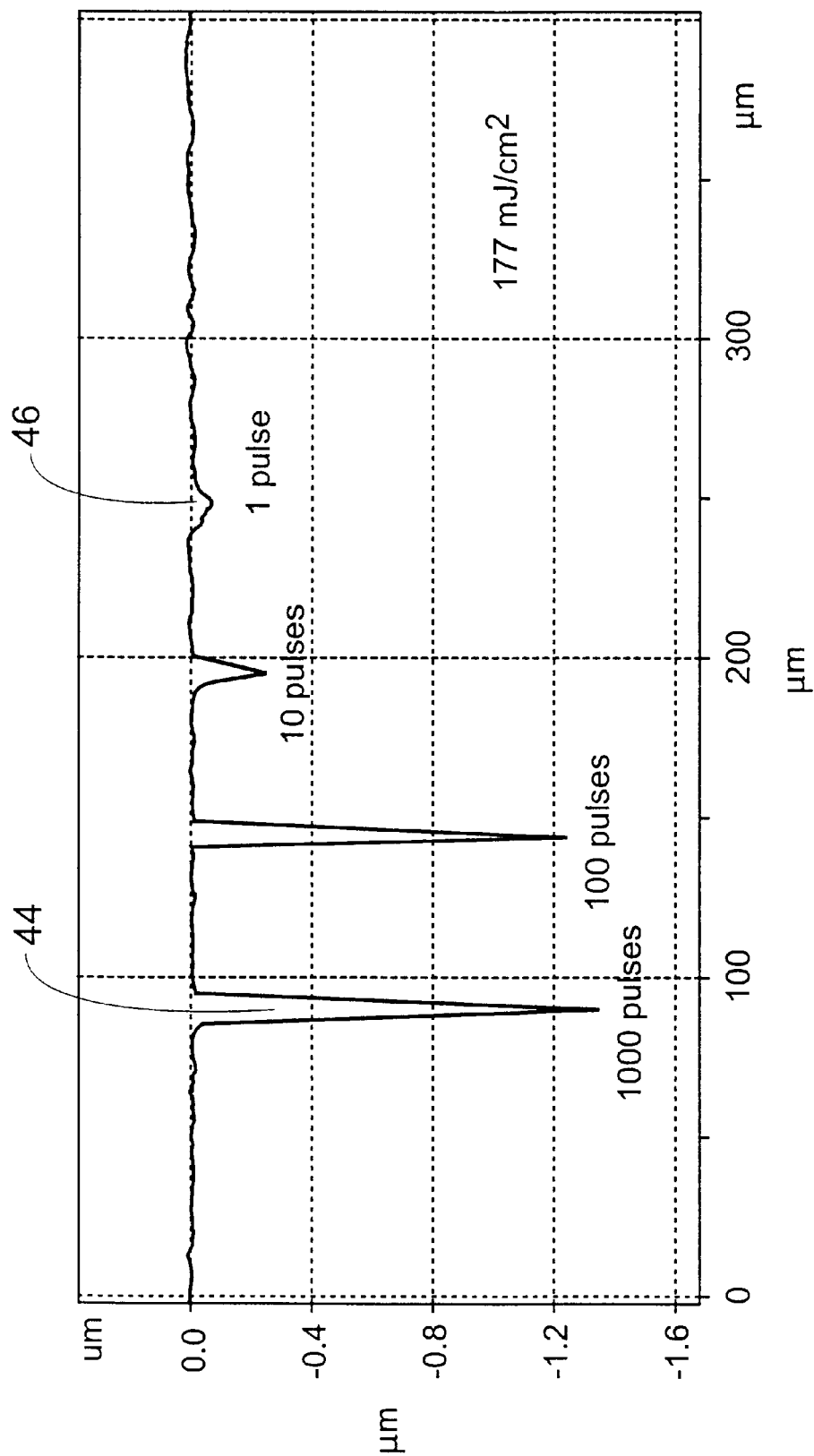
FIG. 6 shows an alpha-step profile scan of parts of the surface of a sample after applying a third step of the method of the second embodiment.

FIG. 6 shows an alpha-step profile scan of parts of the surface which were exposed to an energy fluence of 177 $mJcm^{-2}$, which is above the ablation threshold. Different parts received different numbers of pulses, ranging from the left-hand feature 44 which received 1000 pulses, to the right hand feature 46 which received 1 pulse. All the features are holes formed by the removal of material by ablation. A higher number of pulses gives more ablation and a deeper hole, so that the left-hand feature 44 is much deeper than the right-hand feature 46. However, it is clear that the ablation rate per pulse decreases with an increasing number of pulses, as the depths of the holes are not directly proportional to the numbers of pulses.

Figure 7:
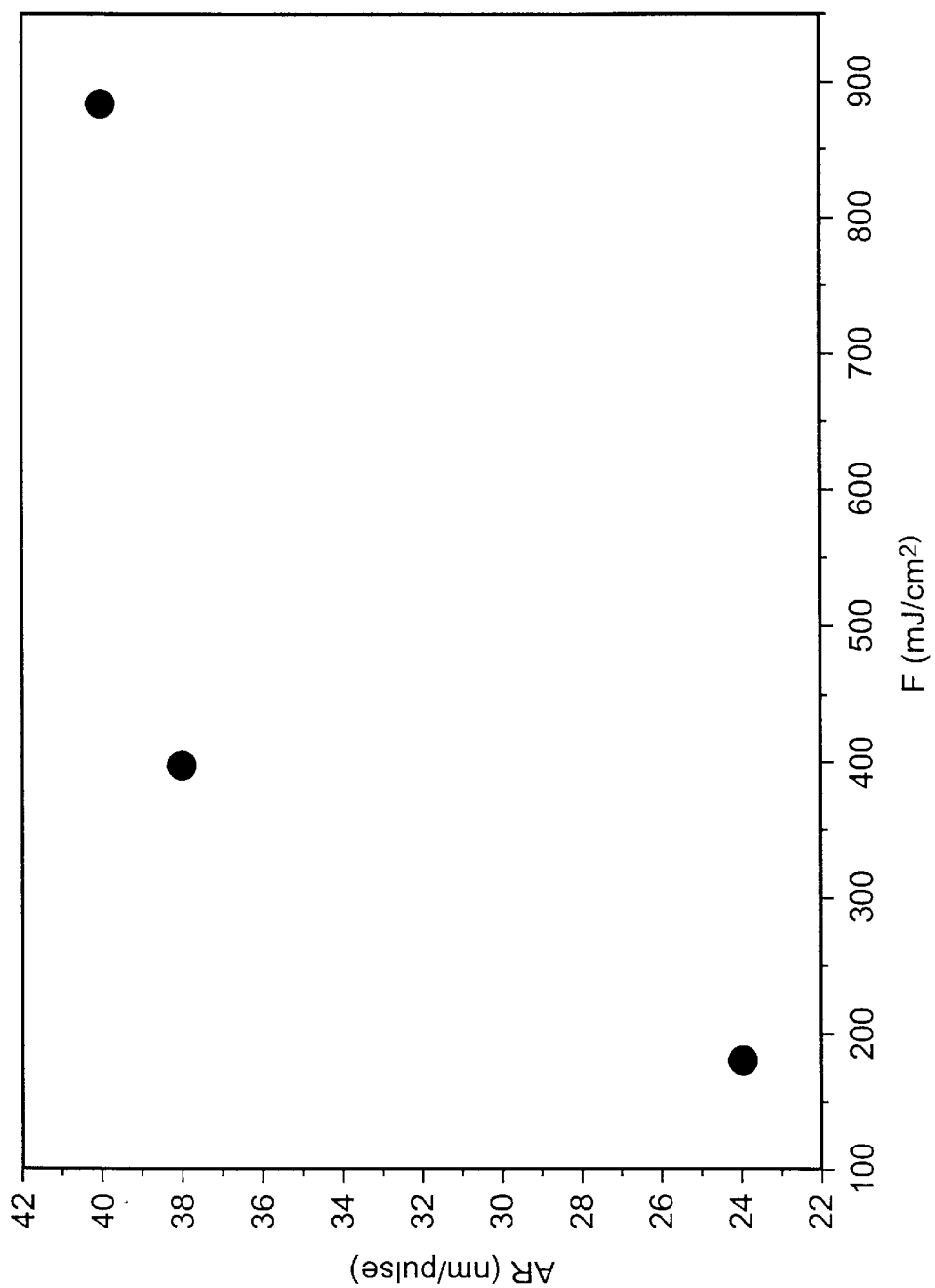
FIG. 7 shows a graph of material ablation rate against energy fluence of illumination applied to the material for the second embodiment.

FIG. 7 shows a graph of ablation rate AR against energy fluence F, which shows that the ablation rate increases with increasing energy fluence above the ablation threshold. The ablation rate is measured in nanometers of ablation per pulse of illumination, for 10 pulses.

Figure 8:
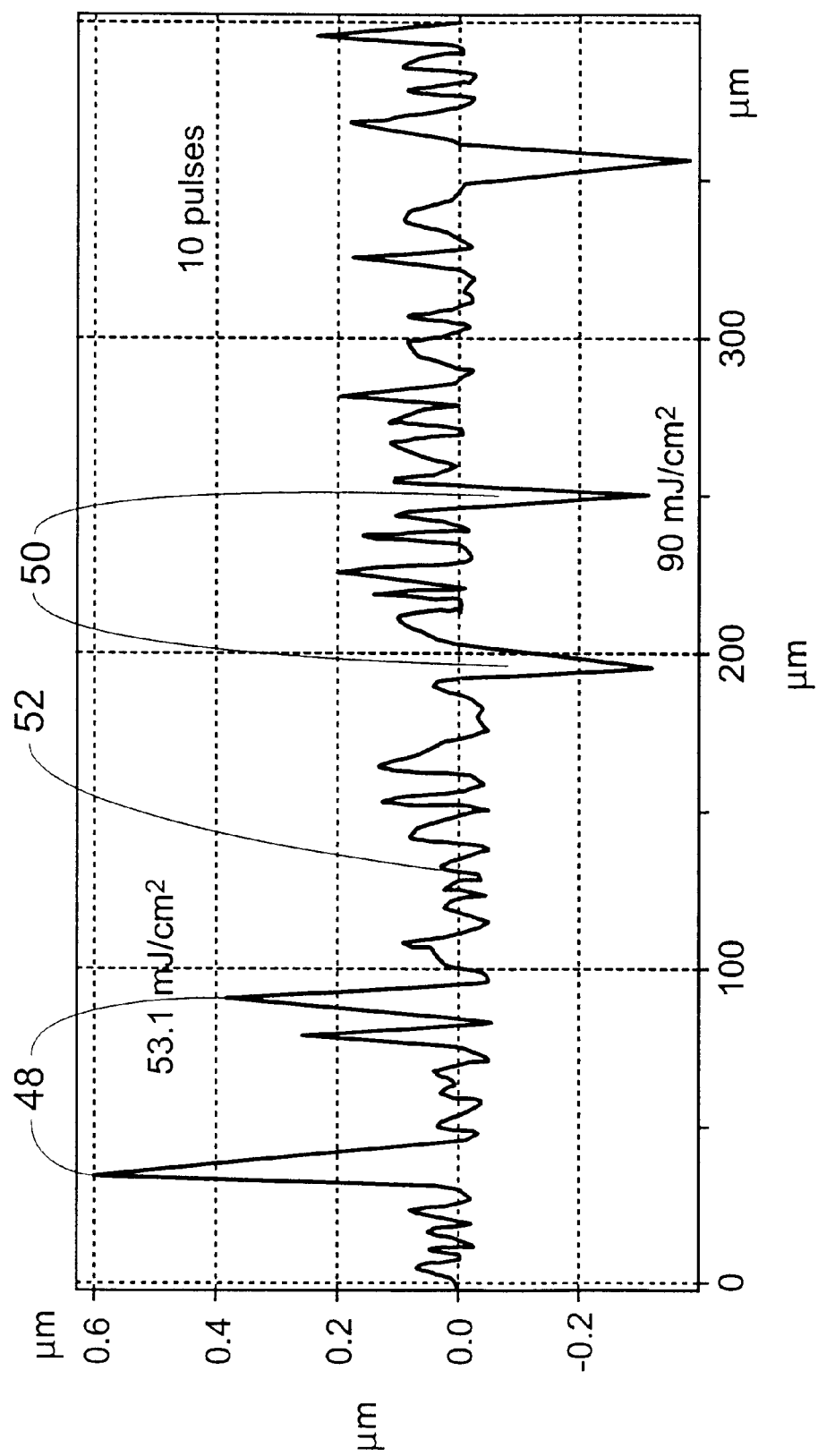
FIG. 8 shows an alpha-step profile scan of parts of the surface of a sample of material fabricated according to the second embodiment.

FIG. 8 shows an alpha-step profile scan of parts of the surface illuminated below the ablation threshold and parts illuminated above the ablation threshold, and then etched for an hour after illumination. This illustrates how the method of the second embodiment can produce a multi-level surface structure by combining etch frustration and ablation.

All features in the scan were exposed to 10 pulses of illumination. The left-hand features 48 were illuminated at an energy fluence of 53.1 $mJcm^{-2}$, which is below the ablation threshold. Therefore, these parts of the surface were subject to etch frustration, and formed upstanding features. The etch rate was frustrated by ~80% (c.f. the reduction in etch rate of ~20% for the results of FIG. 5. This reveals how the frustration increases with increasing energy fluence). The right-hand features 50 were illuminated at an energy fluence of 90 $mJcm^{-2}$, which is above the ablation threshold. Therefore, these parts of the surface were ablated to form holes in the normally etched surface 52.

SUMMARY

The methods of microstructuring according to the present invention have wide application as regards the manufacture of ferroelectric devices, especially those for the photonics and telecommunications industries. Such devices frequently require a micron or sub-micron surface structure, which may be readily applied by use of the methods according to the present invention. Examples of devices which may be made by these methods include modulators, couplers and optical switches
  waveguide gratings
  tunable structures for wavelength agility
  gratings for feedback in integrated optical formats
  gratings for active frequency control of lasers
  gratings for wavelength division multiplexing applications involving channel swapping
  filters
  input/output taps on waveguides
  microstructures for photonic bandgap applications
  microstructures for micro opto-electro-mechanical systems
  microstructures for micro-electro-mechanical systems
  microstructures for piezo-based scanning tips
  devices for assisting fiber positioning on waveguide devices.

It will also be understood that the above described embodiments of the invention may be implemented in a variety of ferroelectric materials. As well as lithium niobate, further examples of suitable materials are lithium tantalate, sodium barium niobate, strontium barium niobate, potassium titanyl niobate (KTN), potassium titanyl phosphate (KTP), rubidium titanyl arsenate (RTA), isomorphs of KTP, RTA, barium titanate, potassium titanate. Alloys based on these compounds may also be used. These materials are understood to display differential etching similar to that described for $LiNbO_3$, whereby the +z face etches much less than the −z face. The materials share a common crystal structure, $ABO_3$, called perovskite crystals. The ease with which the methods of the present invention can be applied varies between materials. Domain engineering (by methods including electric field poling, and application of mechanical and acoustic forces) is necessary to achieve −z and +z faces. This is routinely achievable in $LiNbO_3$, for example, but is more difficult in, say, $BaTiO_3$ in which spontaneous domain rearranging can occur at room temperature. Thus it is less straightforward to obtain the necessary −z face.

In addition, any of the preceding materials may include dopants such as titanium, zinc, erbium, neodymium, ytterbium, holmium, barium, cerium, rubidium, magnesium, or magnesium oxide. This is in contrast to doping $LiNbO_3$ with iron, which gives the previously reported etch frustration effects using visible light [1,2]. Iron can exist in $LiNbO_3$ in a dual valence state ($Fe^{3+}$ and $Fe^{2+}$). Absorption of a visible photon by an $Fe^{2+}$ ion forms $Fe^{3+}$ and an electron. The electron can move to the surface of the sample, so that surface charge can accumulate and affect the etching process. Dopants which do not exhibit dual valance in the host material do not participate in the etching process in this way. Thus, etch frustration according to the present invention can be carried out.

REFERENCES

[1] Barry I. E., Eason R. W., Cook G., *Applied Surface Science*, 143, 328–331 (1999)
[2] Boyland A. J., Mailis S., Barry I. E., Eason R. W., *Applied Physics Letters*, 77, 2792–2794 (2000)
[3] Mailis S., Ross G. W., Reekie L., Abernethy J. A., Eason R. W., *Electronics Letters* 36, 1801 (2000)
[4] WO 98/46813

What is claimed is:

1. A method of structuring a surface of a sample of ferroelectric material, the method comprising:
   a) taking a sample of ferroelectric material having a −z face which is to be etched;
   b) illuminating the −z face with ultraviolet light to define illuminated and unilluminated parts of the surface; and
   c) immersing the −z face in an etchant to selectively remove the unilluminated parts of the −z face at a greater rate than the illuminated parts.

2. A method according to claim 1, in which the ferroelectric material is lithium niobate.

3. A method according to claim 1, in which the ferroelectric material contains less than 0.01 wt % of iron.

4. A method of structuring a surface of a sample of ferroelectric material, the method comprising:
   a) taking a sample of ferroelectric material having a face which is to be structured;
   b) modifying parts of the face by illumination with ultraviolet light having an energy fluence below the threshold for ablating the material, so that the parts of the face which are modified become more resistant to subsequent wet-etching than the parts of the face which have not been illuminated; and
   c) ablating parts of the face by illumination with ultraviolet light having an energy fluence above the threshold for ablation of the material so that those parts of the face are removed by ablation.

5. A method according to claim 4, in which step c) is performed before step b).

6. A method according to claim 4, in which steps b) and c) are performed together by moving a beam of the ultraviolet light over the surface of the sample, while varying the energy fluence of the beam above and below the threshold for ablating the material to respectively ablate and modify the parts of the face being illuminated.

7. A method according to claim 4, further comprising:
   d) subjecting the face to wet-etching using an etchant, the etchant removing the parts of the face modified by illumination in step b) at a slower rate than the parts of the face not modified by illumination in step b).

8. A method according to claim 4, in which the ultraviolet light is pulsed.

9. A method according to claim 4, in which the face is the −z face of the material.

10. A method according to claim 4, in which the ferroelectric material is lithium niobate.

11. A method according to claim 4, in which the ferroelectric material contains less than 0.01 wt % of iron.

12. A structured sample of ferroelectric material obtained by a method according to claim 1.

13. A structured sample of ferroelectric material obtained by a method according to claim 4.

* * * * *